United States Patent
Fan et al.

(10) Patent No.: US 8,987,013 B2
(45) Date of Patent: Mar. 24, 2015

(54) METHOD OF INSPECTING MISALIGNMENT OF POLYSILICON GATE

(71) Applicant: Shanghai Huali Microelectronics Corporation, Shanghai (CN)

(72) Inventors: Rongwei Fan, Shanghai (CN); Hunglin Chen, Shanghai (CN); Yin Long, Shanghai (CN); Qiliang Ni, Shanghai (CN)

(73) Assignee: Shanghai Huali Microelectronics Corporation, Shanghai (CN)

( * ) Notice: Subject to any disclaimer, the term of this patent is extended or adjusted under 35 U.S.C. 154(b) by 0 days.

(21) Appl. No.: 14/142,584

(22) Filed: Dec. 27, 2013

(65) Prior Publication Data
US 2015/0004723 A1 Jan. 1, 2015

(30) Foreign Application Priority Data
Jun. 27, 2013 (CN) .......................... 2013 1 0262927

(51) Int. Cl.
*H01L 21/66* (2006.01)
*G01R 31/307* (2006.01)

(52) U.S. Cl.
CPC .............. *H01L 22/14* (2013.01); *G01R 31/307* (2013.01); *H01L 22/12* (2013.01); *H01L 22/34* (2013.01); *H01L 22/30* (2013.01)
USPC .... 438/17; 257/48; 257/E21.529; 257/E21.53

(58) Field of Classification Search
CPC ......... H01L 22/12; H01L 22/30; H01L 22/34; H01L 22/14; G01R 31/307
USPC ...................... 438/7, 17, 18, 299, 16; 257/48, 257/E21.529, E21.53
See application file for complete search history.

(56) References Cited

U.S. PATENT DOCUMENTS

| 3,750,268 | A  | * | 8/1973  | Wang ............................ 438/301 |
| 6,297,644 | B1 | * | 10/2001 | Jarvis et al. .................. 324/537 |
| 6,716,653 | B2 | * | 4/2004  | Look et al. ..................... 438/14 |
| 6,855,568 | B2 | * | 2/2005  | Weiner et al. .................. 438/17 |
| 7,015,050 | B2 | * | 3/2006  | Huang et al. ................... 438/14 |
| 7,217,581 | B2 | * | 5/2007  | Huang et al. ................... 438/16 |
| 7,939,348 | B2 | * | 5/2011  | Lim et al. ....................... 438/18 |
| 7,967,995 | B2 | * | 6/2011  | Funk et al. ..................... 216/59 |
| 8,339,449 | B2 | * | 12/2012 | Lim et al. ...................... 348/126 |
| 8,516,400 | B2 | * | 8/2013  | Kuo et al. ....................... 716/51 |
| 2007/0296447 | A1 | * | 12/2007 | Bae et al. ...................... 324/765 |
| 2008/0237487 | A1 | * | 10/2008 | Pinto et al. ................. 250/492.1 |
| 2008/0246030 | A1 | * | 10/2008 | Satya et al. .................... 257/48 |
| 2009/0057664 | A1 | * | 3/2009  | Lim et al. ....................... 257/48 |
| 2011/0268363 | A1 | * | 11/2011 | Osaki et al. ................... 382/209 |
| 2012/0257041 | A1 | * | 10/2012 | Nakagaki et al. .............. 348/80 |
| 2014/0367570 | A1 | * | 12/2014 | Kimba et al. ................. 250/307 |
| 2014/0377888 | A1 | * | 12/2014 | Fan et al. ....................... 438/14 |

* cited by examiner

*Primary Examiner* — Mary Wilczewski
(74) *Attorney, Agent, or Firm* — Muncy, Geissler, Olds & Lowe, P.C.

(57) ABSTRACT

A method of inspecting misalignment of a polysilicon gate is disclosed, characterized in forming only NMOS devices in P-wells in a test wafer and utilizing an advanced electron beam inspection tool operating with a positive mode to carry out electrical defect inspection. The method can be applied in precisely figuring out the in-plane misalignment of the polysilicon gates of an in-process semiconductor product and identifying a misalignment tendency therebetween across a wafer by verifying all locations of interest thereon, thus providing a methodology for process window optimization and on-line monitoring and contributing to the manufacturing process and yield improvement.

6 Claims, 5 Drawing Sheets

METHOD OF INSPECTING MISALIGNMENT OF POLYSILICON GATE

CROSS-REFERENCES TO RELATED APPLICATIONS

This application claims the priority of Chinese patent application number 201310262927.8, filed on Jun. 27, 2013, the entire contents of which are incorporated herein by reference.

TECHNICAL FIELD

The present invention relates to the fabrication of semiconductor devices, and more particularly to a method for inspecting misalignment of a polysilicon gate.

BACKGROUND

With the development of the integrated circuit (IC) technology and increasing shrinkage of device critical dimensions, various new materials and processes are being introduced in this art to satisfy the ever-changing requirements associated therewith, necessitating high-accuracy alignment between different features.

Most existing solutions developed to verify the availableness of a satisfactory alignment accuracy follow the conception of measuring alignment deviations between different features in an optical scheme. Provided that any optical system has a maximum achievable resolution, which is deemed to be exceeded by a requested resolution increasing with the continuous scaling-down of the desired electronic devices, it is considered these existing solutions are not fundamental.

FIG. 1 is a transmission electron microscope (TEM) image of a structure resulting from a process intended to form a contact connected to a gate structure and an active area. As seen from the figure, the gate structure on the left side is misaligned with the contact, rendering the whole structure defective.

In fact, even a little deviation in the alignment between the contact and gate structure, in particular, after the technology node scaling down to 65 nm or below, may lead to failure of the whole device being fabricated to which they are belonging.

Thus, there is a substantial need for a novel method capable of more accurate detection of misalignment of the gate structure.

SUMMARY OF THE INVENTION

The present invention seeks to meet the above stated need by providing a method of inspecting misalignment of a polysilicon gate.

To achieve the aforementioned objective, the present invention provides a method of inspecting misalignment of a polysilicon gate, including the following steps in the sequence set forth: providing a test wafer and defining a plurality of first active areas and a plurality of second active areas on the test wafer, wherein the plurality of first active areas and the plurality of second active areas horizontally extend in a first direction and each adjacent two of the plurality of first active areas and the plurality of second active areas are isolated from each other by an isolation structure; implanting P-type ions without using a photoresist mask to form a P-well in each of the plurality of first active areas and the plurality of second active areas; forming a plurality of first polysilicon gates above a surface of the test wafer, wherein the plurality of first polysilicon gates horizontally extend in a second direction perpendicular to the first direction and each has a first end above one of the plurality of first active areas and a second end above a corresponding one of the plurality of second active areas; implanting N-type ions without using a photoresist mask to form an N-type implantation region in each P-well; forming one or more first contact electrodes on each N-type implantation region of the plurality of first active areas and forming one or more second contact electrodes on each N-type implantation region of the plurality of second active areas; and performing electrical defect inspection on each first contact electrode and on each second contact electrode using an advanced electron beam inspection tool in a positive mode, wherein if both a first contact electrode near a first end of one of the plurality of first polysilicon gates and a second contact electrode near a second end of said one of the plurality of first polysilicon gates appear bright in an image generated from the advanced electron beam inspection tool, and the bright first contact electrode and the bright second contact electrode are on a same side of said one of the plurality of first polysilicon gates, then said one of the plurality of first polysilicon gates is identified as misaligned.

In a preferred embodiment, the electrical defect inspection is performed with the E-beam defect scan tool at an electron landing energy of 600 eV to 1200 eV.

In a preferred embodiment, the electrical defect inspection is performed with the E-beam defect scan tool at a current of 7 nA to 20 nA.

In a preferred embodiment, the E-beam defect scan tool has an imaging pixel size of 50 nm to 80 nm.

In a preferred embodiment, the method further includes forming a plurality of second polysilicon gates above the surface of the test wafer prior to implanting N-type ions, wherein the plurality of second polysilicon gates horizontally extend in the second direction and each has a first end above one of the plurality of second active areas and a second end above another one of the plurality of second active areas.

In a preferred embodiment, the isolation structure is a shallow trench isolation, a deep trench isolation or a field oxide.

The present invention can be applied in precisely figuring out the in-plane misalignment of a polysilicon gate with respect to the contact layer of an in-process semiconductor product and identifying a misalignment tendency therebetween across a wafer by verifying all locations of interest thereon, thereby providing a methodology for process window optimization and on-line monitoring and contributing to the manufacturing process and yield improvement.

BRIEF DESCRIPTION OF THE DRAWINGS

A more complete appreciation of the invention and the attendant advantages and features thereof will be readily obtained by reference to the following detailed description when considered in connection with the accompanying drawings, wherein.

Note that the figures of the accompanying drawings are illustrative only and are not intended to limit the scope of the present invention, and they may not be drawn precisely to scale. In the drawings, like reference numerals indicate identically or functionally similar elements.

DETAILED DESCRIPTION

The present invention will become more apparent and fully understood from the following detailed description of exemplary embodiments thereof, which is to be read in connection with the accompanying drawings.

Figure 1:
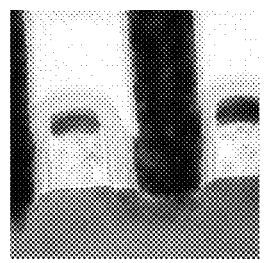
FIG. 1 is a TEM image depicting a contact intended to be connected to a gate structure and an active region but misaligned with the gate structure.
Figure 2:
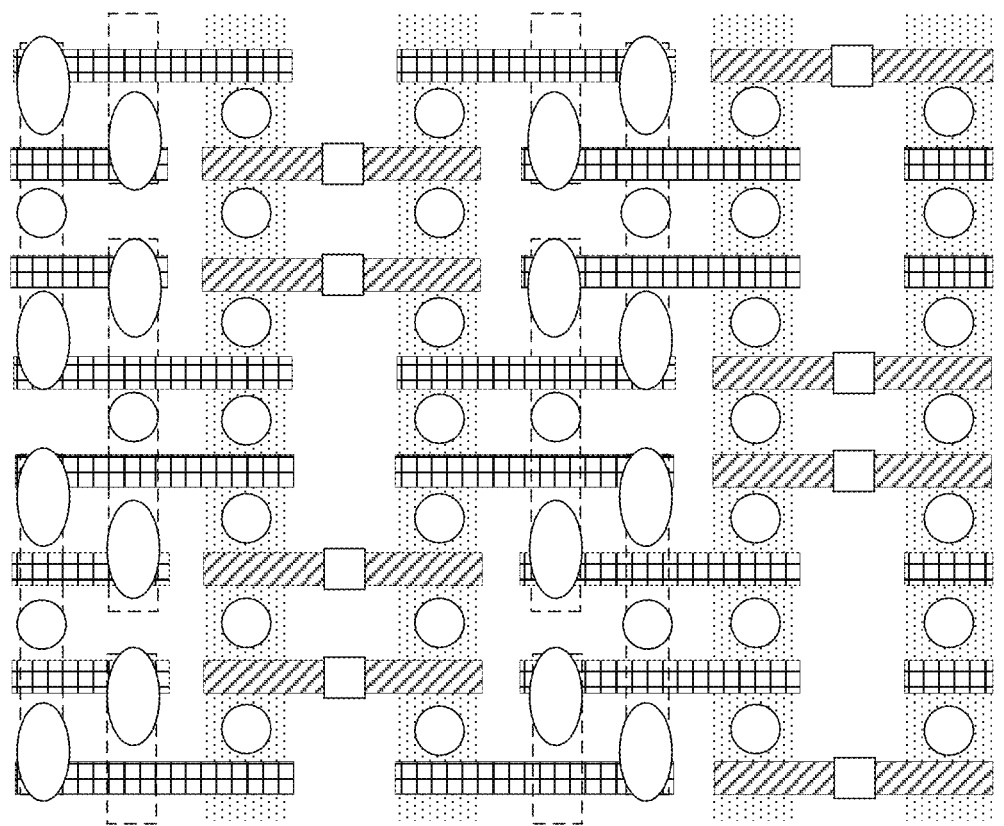
FIG. 2 is a top view of a layout of the connection of active areas, polysilicon gates and contacts of a six-transistor SRAM.
Figure 2:
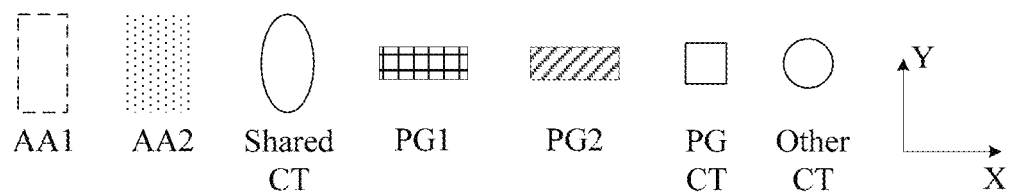

Please refer to FIG. 2, which is a top view of a layout of the connection of active areas, polysilicon gates and contacts of a six-transistor (6-T) static random access memory (SRAM). The 6-T SRAM as shown in FIG. 2 is in normal condition, namely all the polysilicon gates are in good alignment with the contact layer. As shown in FIG. 2, the 6-T SRAM includes plurality of first active areas AA1 for forming PMOS cells therein and a plurality of second active areas AA2 for forming NMOS cells therein. Both first and second active areas AA1 and AA2 extend in the Y direction. First polysilicon gates PG1 each having an end above a first active area AA1 and the other end above a second active area AA2 are marked with grid lines, while second polysilicon gates PG2 each having an end above one of the second active areas AA2 and the other end above another one of the second active areas AA2 are marked with oblique lines. All these polysilicon gates PG1 and PG2 extend in the X direction, which is perpendicular with the Y direction. Contact (CT) plugs are formed over PMOS cells, NMOS cells and second polysilicon gates. In FIG. 2, the CT plug types include shared CT plug with elliptic shape, PG (polysilicon gate) CT plug with square shape and other CT plug with circle shape. The other CT plugs may include VDD CT plug, VSS CT plug, NN (NMOS Node) CT plug and BL (Bit Line) CT plug.

In a 6-T SRAM as shown in FIG. 2, misalignment of a polysilicon gate with respect to the contacts may lead to undesired interconnection between contact electrodes adjacent to this polysilicon gate and may further cause electrical leakage in both the NMOS and PMOS cells connected to the contact electrodes. Such electrical leakage can be inspected by using an advanced electron beam inspection tool, but requires two inspections respectively in a positive mode and a negative mode followed by a defect distribution mapping step to identify the misaligned polysilicon gate. This is because NMOS leakages can only be viewed by positive mode of the inspection tool, while PMOS leakages can only be viewed by negative mode of the inspection tool.

Figure 3A:
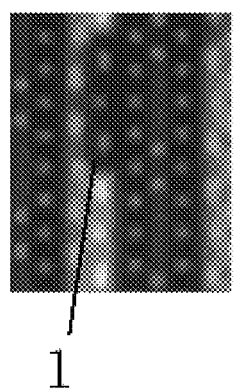
FIG. 3A is an image generated from an advanced electron beam inspection tool operating with a negative mode, depicting an electrical defect in a PMOS cell of a six-transistor SRAM.
Figure 3B:
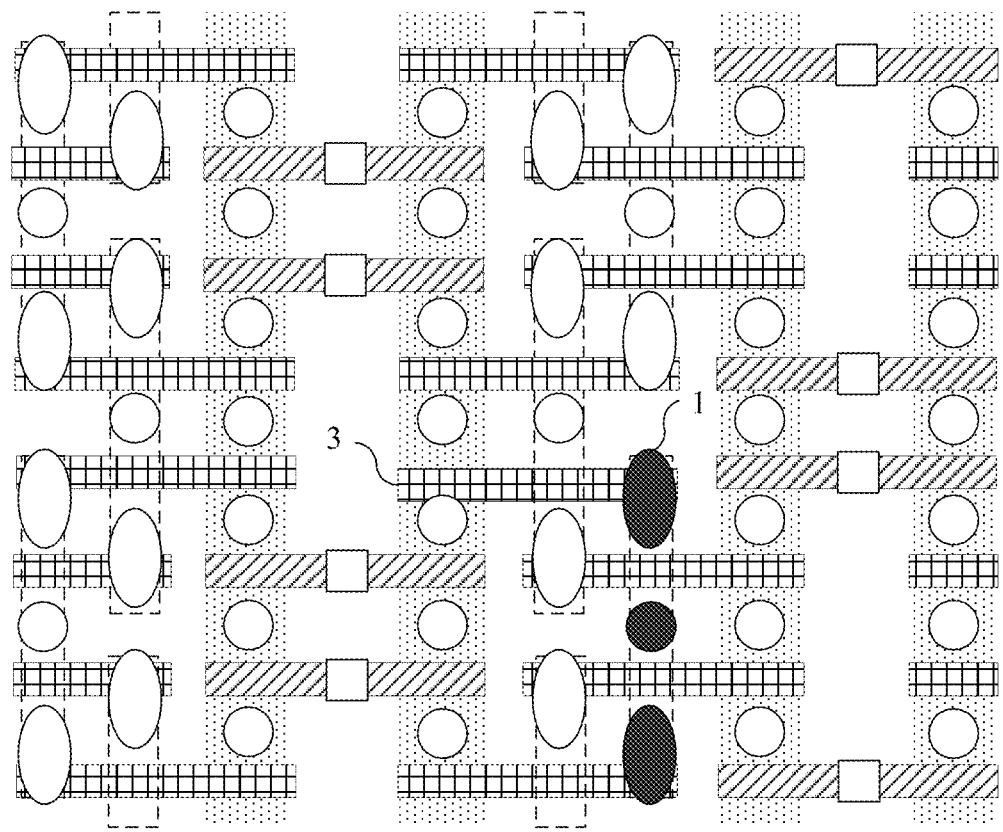
FIG. 3B is an illustration of the electrical defect of FIG. 3A in a top view of the six-transistor SRAM.
Figure 3B:
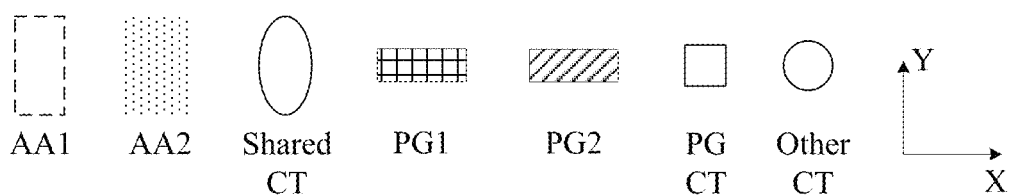
Figure 3C:
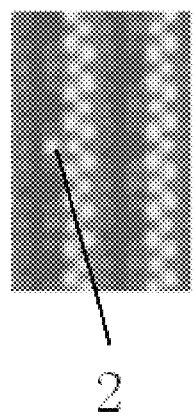
FIG. 3C is an image generated from an advanced electron beam inspection tool operating with a positive mode, depicting an electrical defect in an NMOS cell of a six-transistor SRAM.
Figure 3D:
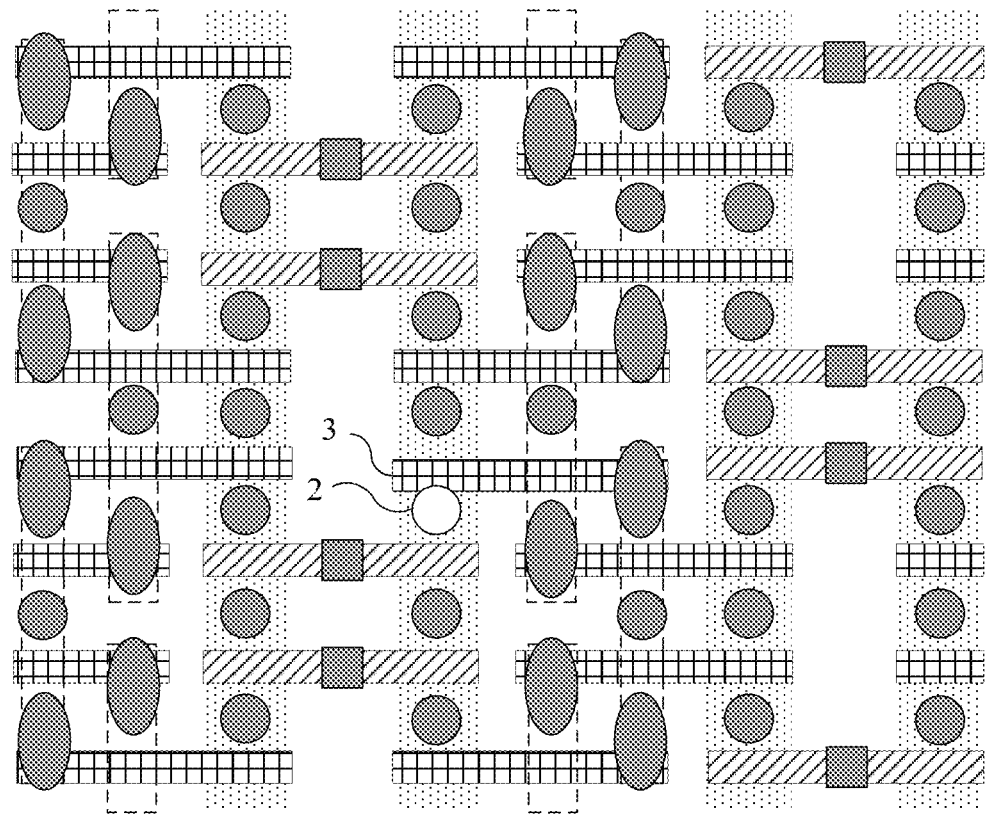
FIG. 3D is an illustration of the electrical defect of FIG. 3C in a top view of the six-transistor SRAM.
Figure 3D:
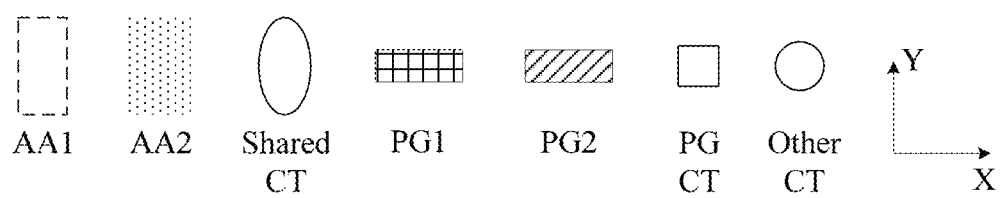

For instance, a first inspection of a 6-T SRAM in a negative mode finds an electrical defect 1 in a PMOS cell, which appears to be a dark voltage contrast (VC) image as shown in FIG. 3A. An illustration of this electrical defect 1 is also provided in FIG. 3B. Further, a second inspection of the 6-T SRAM in a positive mode finds another electrical defect 2 in an NMOS cell, which appears to be a bright VC image as shown in FIG. 3C. An illustration of this electrical defect 2 is also provided in FIG. 3D. By comparing FIGS. 3B and 3D, we can see that defect 1 is adjacent to one end of polysilicon gate 3 and defect 2 is adjacent to the other end of polysilicon gate 3 and both defects 1 and 2 are on the −Y side of the polysilicon gate 3. Based on the above two inspections and comparison, we finally conclude that polysilicon gate 3 is deviated in the −Y direction, and hence leads to electrical leakages in adjacent PMOS and NMOS cells.

Apparently, the above method for identifying misalignment of a polysilicon gate with respect to contacts is very complicated and time consuming.

In pursuit of precise defect identification and quantitation, the present invention provides a method capable of figuring out the in-plane misalignment of polysilicon gates with respect to contacts using an advanced electron beam inspection tool and identifying a misalignment tendency across a wafer by verifying all locations of interest thereon, thereby providing methodology for process window optimization and in-line monitoring and contributing to the manufacturing process and yield improvement.

Figure 4:
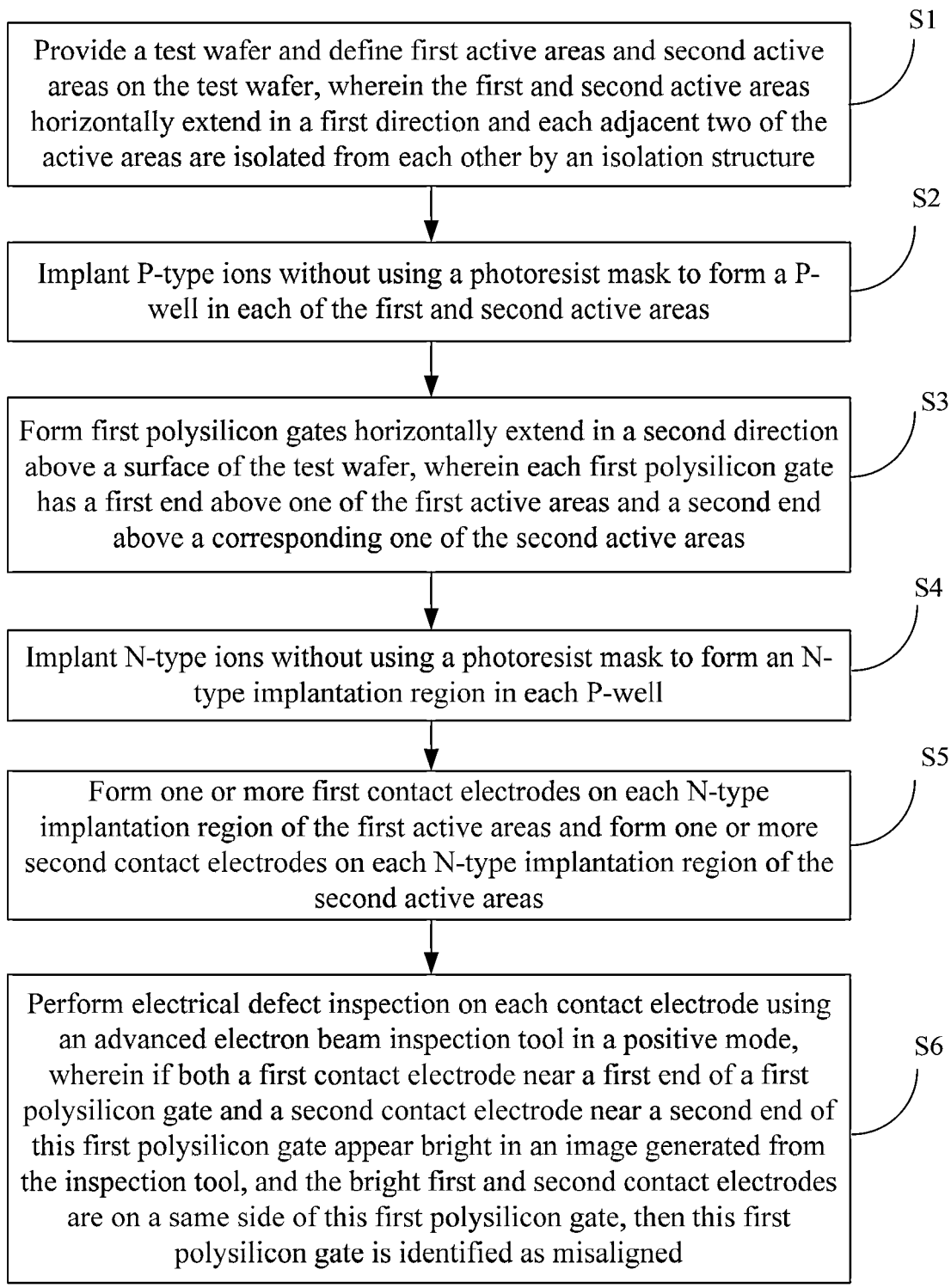
FIG. 4 is a flow chart illustrating a method of inspecting misalignment of a polysilicon gate with respect to contacts.
Figure 5:
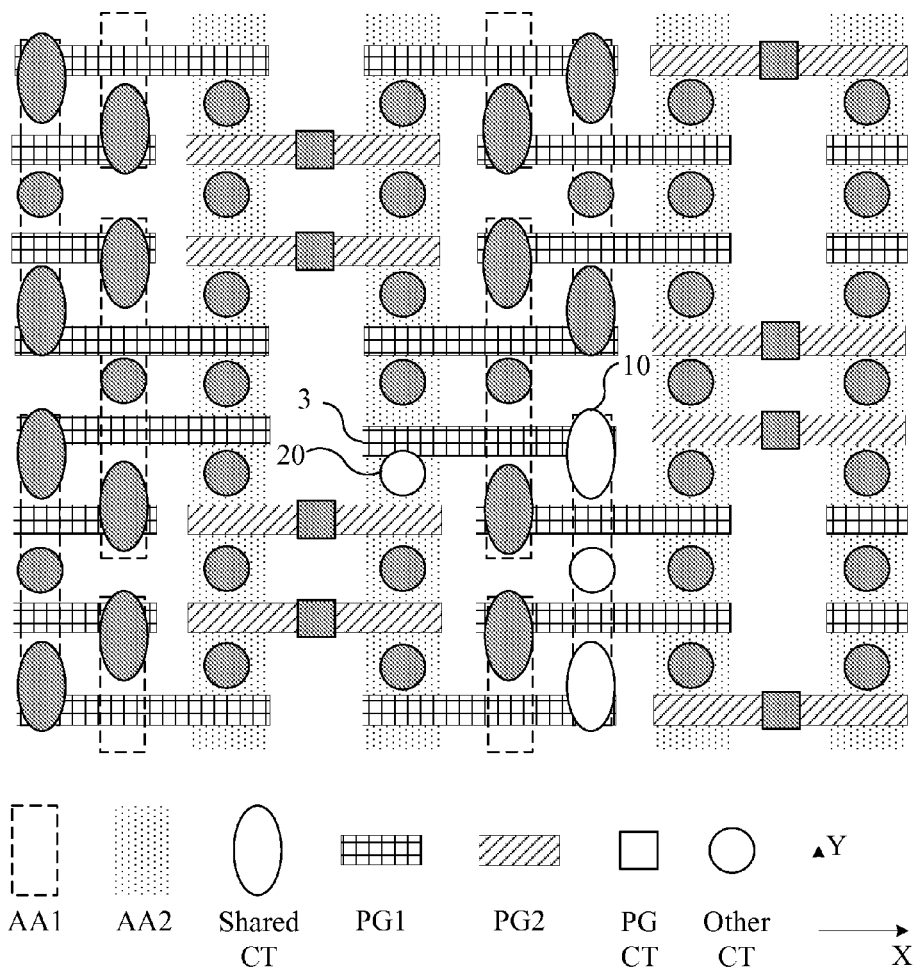
FIG. 5 is a top view depicting a misaligned polysilicon gate inspected by using the method of the present invention.

FIG. 4 is a flow chart illustrating a method of inspecting misalignment of a polysilicon gate with respect to contact electrodes according to a preferred embodiment of the invention. FIG. 5 is a top view depicting a misaligned polysilicon gate inspected by using the method of the present invention.

Referring to both FIG. 4 and FIG. 5, in a first step S1 of the method, a test wafer defining a plurality of first active areas AA1 and a plurality of second active areas AA2 is provided, wherein the plurality of first active areas AA1 and the plurality of second active areas AA2 extend in the Y direction of a horizontal plane as shown in FIG. 5; first active areas AA1 are designated for forming PMOS cells while second active areas AA2 are designated for forming NMOS cells in the actual manufacturing process of the 6T SRAM device. Each adjacent two of the first and second active areas may be isolated from each other by an isolation structure, e.g., a shallow trench isolation (STI) structure, a deep trench isolation (DTI) structure, or a field oxide layer.

Next, in a second step S2, P-type ions are implanted in the wafer without using a photoresist mask, namely implanted over the whole wafer, to form a P-well in each of the first active areas and second active areas.

After that, in a third step S3, a plurality of first and second polysilicon gates PG1 and PG2 extending in the X direction are formed above a surface of the test wafer as shown in FIG. 5. Each of the first polysilicon gates PG1 has a first end above a first active area AA1 and a second end above a second active area AA2. Each of the second polysilicon gates PG2 has a first end above one of the first active areas AA1 and a second end above another one of the first active areas AA1.

In a fourth step S4, N-type ions are implanted in the wafer without using a photoresist mask to form an N-type implantation region in each P-well.

As such, after the preceding steps S1 to S4, each P-well is formed therein with an n-channel metal-oxide semiconductor (NMOS) cell.

Next, in a fifth step S5 of the method, one or more first contact electrodes are formed on each N-type implantation region of the first active areas AA1 and one or more second contact electrodes are formed on each N-type implantation region of the second active areas AA2. This step may include: coating the wafer with an insulating layer; etching one or more contact holes above each first and second active area; filling each contact hole with metal; and removing undesirable metal using a planarization process (e.g., a chemical mechanical polishing (CMP) process).

Lastly, in a sixth step S6, electrical defect inspection is performed on each first contact electrode and each second contact electrode using an advanced electron beam inspection tool operating in a positive mode. If both a first contact electrode near a first end of a first polysilicon gate PG1 and a second contact electrode near a second end of this first polysilicon gate PG1 appear bright in an image generated from the advanced electron beam inspection tool, and the bright first contact electrode and the bright second contact electrode are on a same side of this first polysilicon gate PG1, then this first polysilicon gate PG1 is identified as misaligned with the contacts.

Compared with a real product wafer, the test wafer prepared by using the method of the present invention has all the PMOS cells in N-wells changed to NMOS cells in P-wells. As such, those electrical defects in the product wafer that are only observable in two respective inspections can now be observed by a single inspection. Please refer to FIGS. 3B, 3D and 5. The dark defect 1 in FIG. 3B and the bright defect 2 in FIG. 3D will both appear as bright defects 10 and 20 on the test wafer (see FIG. 5). Since the first contact electrode corresponding to the defect 20 is near a first end of the first polysilicon gate 3 and the second contact electrode corresponding to the defect 10 is near a second end of the first polysilicon gate 3, and the two contact electrodes are on a same side (−Y side in FIG. 5) of the first polysilicon gate 3, it can be concluded that the first polysilicon gate 3 is misaligned with respect to the contact electrodes, and more specifically, the first polysilicon gate 3 is deviated in the −Y direction. Advantageously, the method of the present invention is much simpler compared with the conventional method and can be performed in an in-line manner.

In some embodiments, the electrical defect inspection can be performed with the advanced electron beam inspection tool at an electron landing energy of 600 eV to 1200 eV and a current of 7 nA to 20 nA; and the electrical defect inspection can have an imaging pixel size of 50 nm to 80 nm.

Further, through mapping all electrical defects across a wafer, the invention is also capable of identifying a group of electrical defects distributed in a certain positional relation.

The invention can be applied in precisely figuring out the in-plane alignment of the polysilicon gates of an in-process semiconductor product and identifying a misalignment tendency therebetween across a wafer by verifying all locations of interest thereon, thereby providing a methodology for process window optimization and on-line monitoring and contributing to the manufacturing process and yield improvement.

The invention can also be applied in measuring the lateral diffusion ability of ions trapped in a well region corresponding to the concentration thereof and can thus provide substantial support for semiconductor device fabrication.

In practice, a map of defects caused by misalignment of the polysilicon gates, marked with their severity levels, throughout a short-flow wafer as described supra can be obtained, by summarizing the results of multiple scans of electrical defect inspection using an advanced electron beam inspection tool with a positive mode in accordance with the methods of the present invention, performed on a structure resulting after the wafer is treated by conventional polysilicon and contact photolithography and contact planarization processes. In the electrical defect inspection, when a pair of a P-type contact electrode (corresponding to a contact to a PMOS device in a conventional wafer) and an N-type contact electrode (corresponding to a contact to an NMOS device on a conventional wafer) are both found to have electrical leakage, is the underlying polysilicon gate determined as having defect-causing misalignment. Such a map is particularly useful in providing a methodology for process window optimization and on-line monitoring and can hence contribute to the manufacturing process and yield improvement.

It is to be understood that the preferred embodiments of the present invention presented in the foregoing description are not intended to limit the invention in any way. Those skilled in the art can make various alterations, modifications, and equivalent alternatives in light of the above teachings without departing from the scope of the invention. Thus, it is intended that the present invention covers all such alterations, modifications, and equivalent alternatives that fall within the true scope of the invention.

What is claimed is:

1. A method of inspecting misalignment of a polysilicon gate, comprising the following steps in the sequence set forth:
   providing a test wafer and defining a plurality of first active areas and a plurality of second active areas on the test wafer, wherein the plurality of first active areas and the plurality of second active areas horizontally extend in a first direction and each adjacent two of the plurality of first active areas and the plurality of second active areas are isolated from each other by an isolation structure;
   implanting P-type ions without using a photoresist mask to form a P-well in each of the plurality of first active areas and the plurality of second active areas;
   forming a plurality of first polysilicon gates above a surface of the test wafer, wherein the plurality of first polysilicon gates horizontally extend in a second direction perpendicular to the first direction and each has a first end above one of the plurality of first active areas and a second end above a corresponding one of the plurality of second active areas;
   implanting N-type ions without using a photoresist mask to form an N-type implantation region in each P-well;
   forming one or more first contact electrodes on each N-type implantation region of the plurality of first active areas and forming one or more second contact electrodes on each N-type implantation region of the plurality of second active areas; and
   performing electrical defect inspection on each first contact electrode and on each second contact electrode using an advanced electron beam inspection tool in a positive mode, wherein if both a first contact electrode near a first end of one of the plurality of first polysilicon gates and a second contact electrode near a second end of said one of the plurality of first polysilicon gates appear bright in an image generated from the advanced electron beam inspection tool, and the bright first contact electrode and the bright second contact electrode are on a same side of said one of the plurality of first polysilicon gates, then said one of the plurality of first polysilicon gates is identified as misaligned.

2. The method of claim 1, wherein the electrical defect inspection is performed with the advanced electron beam inspection tool at an electron landing energy of 600 eV to 1200 eV.

3. The method of claim 1, wherein the electrical defect inspection is performed with the advanced electron beam inspection tool at a current of 7 nA to 20 nA.

4. The method of claim 1, wherein the advanced electron beam inspection tool has an imaging pixel size of 50 nm to 80nm.

5. The method of claim 1, further comprising forming a plurality of second polysilicon gates above the surface of the test wafer prior to implanting N-type ions, wherein the plurality of second polysilicon gates horizontally extend in the second direction and each has a first end above one of the plurality of second active areas and a second end above another one of the plurality of second active areas.

6. The method of claim 1, wherein the isolation structure is a shallow trench isolation, a deep trench isolation or a field oxide.

\* \* \* \* \*